US008587943B2

(12) United States Patent  (10) Patent No.: US 8,587,943 B2
Barina et al.  (45) Date of Patent: Nov. 19, 2013

(54) LIQUID-COOLING MEMORY MODULES WITH LIQUID FLOW PIPES BETWEEN MEMORY MODULE SOCKETS

(75) Inventors: Richard M. Barina, Sebring, FL (US); Vinod Kamath, Raleigh, NC (US); Chunjian Ni, Cary, NC (US); Derek I. Schmidt, Raleigh, NC (US); Mark E. Steinke, Durham, NC (US); James S. Womble, Hillsborough, NC (US)

(73) Assignee: International Business Machines Corporation, Armonk, NY (US)

( * ) Notice: Subject to any disclaimer, the term of this patent is extended or adjusted under 35 U.S.C. 154(b) by 161 days.

(21) Appl. No.: 13/305,092

(22) Filed: Nov. 28, 2011

(65) Prior Publication Data

US 2013/0135812 A1  May 30, 2013

(51) Int. Cl.
*H05K 7/20* (2006.01)
*G06F 1/20* (2006.01)

(52) U.S. Cl.
USPC ............ 361/699; 361/679.52; 361/679.53; 361/700; 361/702; 361/716; 361/720; 361/721; 165/104.33; 165/185

(58) Field of Classification Search
USPC ............ 361/679.31–679.32, 679.52–679.54, 361/699–700, 702, 704, 719–721; 165/104.33, 185
See application file for complete search history.

(56) References Cited

U.S. PATENT DOCUMENTS

| 4,186,422 A | 1/1980 | Laermer |
| 4,884,168 A | 11/1989 | August et al. |
| 6,854,993 B1 | 2/2005 | McHugh et al. |
| 7,106,595 B2 * | 9/2006 | Foster et al. ................. 361/721 |
| 7,286,355 B2 * | 10/2007 | Cheon .......................... 361/699 |
| 7,289,327 B2 * | 10/2007 | Goodwin et al. ............ 361/701 |
| 7,408,776 B2 | 8/2008 | Campbell et al. |
| 7,515,416 B2 | 4/2009 | McBain et al. |
| 7,855,888 B2 * | 12/2010 | Peterson ...................... 361/699 |
| 7,907,398 B2 | 3/2011 | Hrehor, Jr. et al. |
| 7,965,509 B2 | 6/2011 | Campbell et al. |
| 7,969,736 B1 * | 6/2011 | Iyengar et al. ............... 361/699 |
| 8,004,841 B2 * | 8/2011 | Cipolla et al. ............... 361/699 |
| 8,027,162 B2 * | 9/2011 | Campbell et al. ........... 361/699 |
| 8,081,473 B2 * | 12/2011 | Cipolla et al. ............... 361/719 |
| 2006/0250772 A1 | 11/2006 | Salmonson et al. |
| 2007/0177352 A1 | 8/2007 | Monfarad et al. |
| 2009/0277616 A1 | 11/2009 | Cipolla et al. |
| 2010/0025010 A1 | 2/2010 | Cipolla et al. |
| 2010/0085712 A1 | 4/2010 | Hrehor, Jr. et al. |
| 2010/0091447 A1 | 4/2010 | Jaggers et al. |

(Continued)

FOREIGN PATENT DOCUMENTS

| WO | WO2011053310 A1 | 5/2011 |
| WO | WO2011053311 A1 | 5/2011 |
| WO | WO2011053313 A1 | 5/2011 |

*Primary Examiner* — Robert J Hoffberg
(74) *Attorney, Agent, or Firm* — Cynthia G. Seal; Jeffrey L. Streets

(57) ABSTRACT

A liquid-cooled computer memory system includes first and second blocks in fluid communication with a chilled liquid source. A plurality of spaced-apart heat transfer pipes extend along a system board between memory module sockets from the first manifold block to the second manifold block. The heat transfer pipes may be liquid flow pipes circulating the chilled liquid between the memory module sockets. Alternatively, the heat transfer pipes may be closed heat pipes that conduct heat from the memory modules to the liquid-cooled blocks. A separate heat spreader is provided to thermally bridge each memory module to the adjacent heat transfer pipes.

16 Claims, 6 Drawing Sheets

(56) References Cited

U.S. PATENT DOCUMENTS

2010/0252234 A1 10/2010 Cambell et al.
2011/0032672 A1 2/2011 Artman et al.
2011/0149505 A1 6/2011 Goth et al.
2011/0209855 A1* 9/2011 Peterson et al. ......... 165/104.26
2013/0027870 A1* 1/2013 Goldr an et al. ......... 361/679.32
2013/0120926 A1* 5/2013 Barina et al. ............. 361/679.32

* cited by examiner

LIQUID-COOLING MEMORY MODULES WITH LIQUID FLOW PIPES BETWEEN MEMORY MODULE SOCKETS

BACKGROUND

1. Field of the Invention

The present invention relates generally to cooling computer systems, and more particularly to liquid-cooling computer memory modules.

2. Background of the Related Art

Computer systems generate heat in relation to their power consumption. Cooling systems are used to maintain system components within prescribed temperature limits for operational reliability and safety. System components contribute in varying amounts to the total heat production of a computer system. While processors are generally the hottest-running components, system memory can consume a significant percentage of the total system power and generate a corresponding amount of heat. In a server, for instance, memory modules may be responsible for as much as 50% of the total heat load. Increasingly powerful component configurations are being developed for use in pre-defined dimensional constraints. For example, server systems often must conform to existing, standardized server chassis dimensions, while other computer systems are becoming more compact. The increased component and thermal densities present significant cooling demands and challenges.

Large computer systems, such as in data centers, typically have a rack-mounted, modular construction. Traditionally, servers and other equipment have been cooled by forced-convection cooling, using air moving devices, such as fans and blowers. These air moving devices are often designed to displace hot air away from the components by creating parallel air flow paths that circulate through the chassis and rack. Air moving systems may take the form of a computer room air conditioning (CRAC) system, a chassis fan system, or fans in an individual node or group of nodes. However, compact chassis form factors and high component density leaves only limited space for airflow. As the density of heat generating components increases, therefore, air cooling solutions are becoming more complicated and costly.

In recent years, liquid cooling has been proposed as an alternative to conventional forced-air convection cooling. Liquid-cooled structures have been shown, in some circumstances such as large data centers, to be more effective at cooling on a per-energy-unit basis. However, current liquid-cooled systems tend to have a higher initial cost and level of design complexity relative to air-cooled systems. Therefore, existing liquid-cooled system can be cost-prohibitive in some installations.

BRIEF SUMMARY

An embodiment of a computer memory system includes a plurality of memory modules sockets spaced apart on a system board. Each memory module socket is configured for releasably receiving a card edge connector of a respective memory module. A liquid flow assembly includes a first block having a liquid flow passage, a second block having a liquid flow passage, a chilled liquid source in fluid communication with the blocks, and a plurality of heat transfer pipes thermally coupling the first block to the second block. The heat transfer pipes extend along the system board between the memory module sockets from the first block to the second block. A plurality of heat spreaders each have a pair of parallel plates in thermal engagement with opposing faces of a respective one of the memory modules and a ridge extending transversely outwardly from at least one of the plates to thermally engage an adjacent one of the heat transfer pipes. The heat transfer pipes may be liquid flow pipes that circulate chilled liquid from one block to the other block. Alternatively, the heat transfer pipes may be closed heat pipes with an isolated working fluid, which conduct heat from the memory modules to the liquid-cooled blocks.

DETAILED DESCRIPTION

Figure 1:
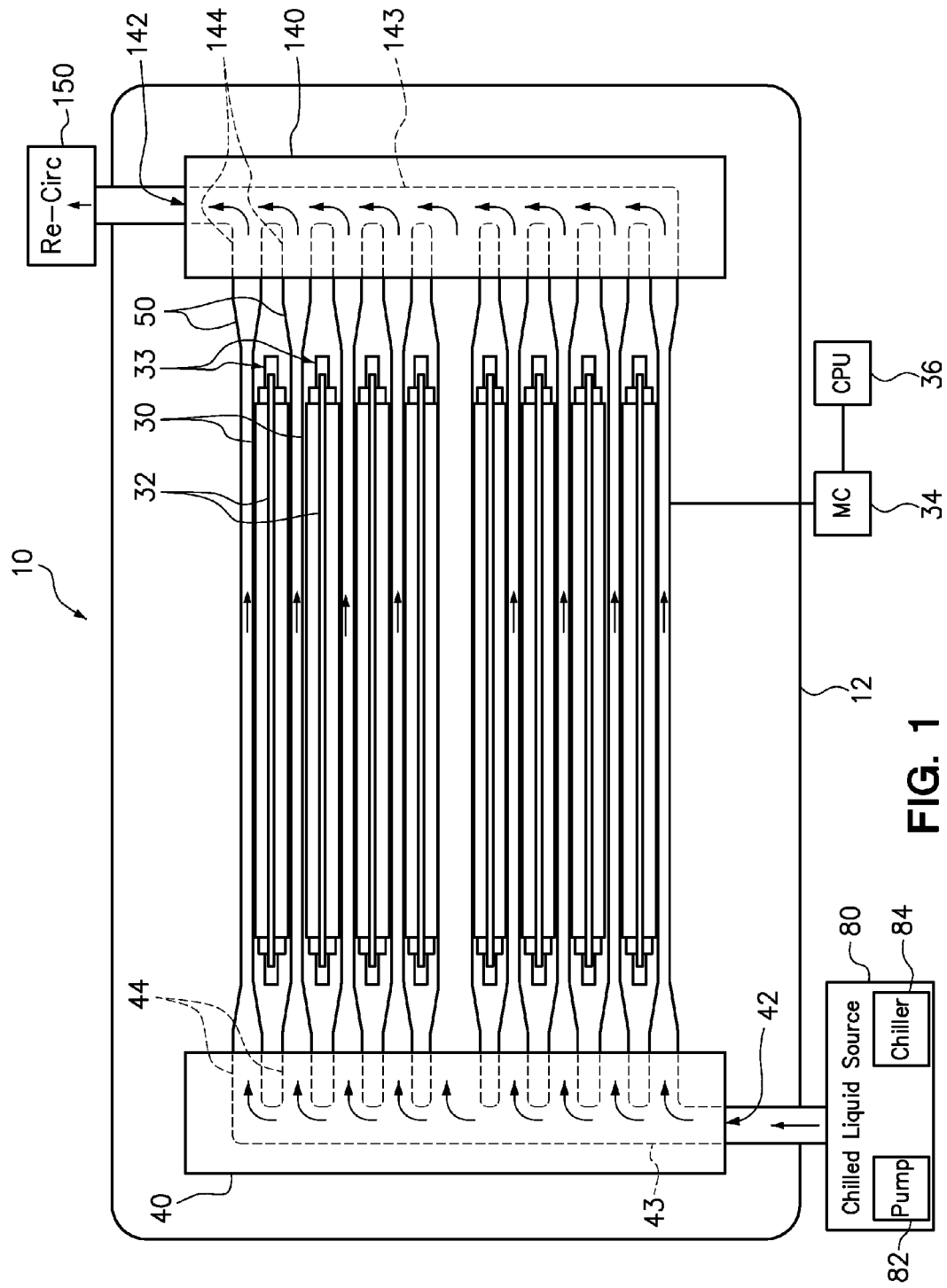
FIG. 1 is a plan view of a cooling system for a computer memory system with a plurality of liquid flow pipes extending along a system board between memory module sockets.

Systems for liquid-cooling memory modules are disclosed that conform to existing chassis dimensions and allow memory modules to be easily serviced by a customer or field technician. The disclosed cooling systems may be applied to a presently available or subsequently developed memory module having memory chips mounted on a circuit board. The example embodiments use standard dual in-line memory modules (DIMMs) having a plurality of dual random access memory (DRAM) chips. Each cooling system includes first and second blocks positioned adjacent to ends of an array or bank of parallel DIMMs. A chilled liquid source supplies chilled liquid to the blocks. A plurality of heat transfer pipes extend along the system board between the DIMM sockets from the first manifold block to the second manifold block. The heat transfer pipes may be liquid flow pipes or heat pipes. Liquid flow pipes are open at each end, and chilled liquid is passed between the DIMMs through the liquid flow pipes, from the first block to the second block. Heat pipes, by contrast, are closed, hollow structures containing a working fluid that evaporates and condenses within the heat pipes to facilitate heat conduction.

A separate heat spreader is provided for each DIMM to conduct heat from each DIMM to the adjacent heat transfer pipes (either heat pipes or liquid flow pipes). Each heat spreader includes parallel heat spreader plates that receive the respective DIMM there between. At least one of the plates on each heat spreader includes a transversely extending ridge (such as a ridge perpendicularly oriented relative to the heat spreader plate) that thermally engages the adjacent pipe. The ridges may be flared ends of the heat spreader plates, where each ridge extends along at least a portion of the length of the respective DIMM. The ridge of a first heat spreader on one DIMM may be interleaved with a ridge on a second heat spreader on an adjacent DIMM, with the first and second ridges in thermal engagement with the same heat transfer pipe. In an embodiment with closed heat pipes, the heat pipes conduct heat to the liquid-cooled blocks. In an embodiment with liquid flow pipes, the chilled coolant is passed through the liquid flow pipes from the first block to the second block, such that the chilled liquid absorbs heat conducted by the heat spreaders from the DIMM to the liquid flow pipes.

A number of features are disclosed, which contribute to the serviceability of memory system components without necessarily affecting existing chassis or system board dimensions. For example, the placement of the liquid-cooled manifold blocks adjacent to the ends of the DIMMs, rather than above the DIMMs, allows the DIMMs to be easily removed and replaced without interference. The heat or liquid flow pipes are also routed low along the system board between the DIMM sockets, so as to avoid interference with accessing the DIMMs. For example, the heat or liquid flow pipes may be low enough to avoid projecting above a height of the DIMM sockets. The heat or liquid flow pipes and heat spreaders are also configured to fit within the space available between adjacent DIMMs having a typical DIMM spacing. The L-shaped cross-section of the heat spreaders along the ridges provides thermal engagement with both the DIMMs and the heat or liquid flow pipes, resulting in a very space-efficient cooling system. Thus, conventional chassis and system board dimensions may be unaffected by the presence of the cooling system components.

FIG. 1 is a plan view of a liquid-cooled computer memory system 10 having a plurality of liquid flow pipes 50 extending along a system board 12 between DIMM sockets 30. The system board 12 is the primary circuit board of a computer, including communication pathways interconnecting system components, such as processors, memory, graphics cards, application cards, and so forth. The system board 12 may be the motherboard of a blade server or a desktop computer, for example. The memory system 10 of the illustrated embodiment is a two-channel memory system, configured for use with four DIMMs per channel. The memory system 10 includes two sets of four DIMM sockets 30 arranged in parallel on the system board 12, with each set belonging to one of the two channels. Each DIMM socket 30 includes a slot 32 for receiving a card edge connector of a DIMM (see FIG. 2). The slot 32 orients the received DIMM perpendicularly to the system board 12. Each DIMM socket 30 also includes a pair of latches 33 operable to selectively release the received DIMM. A typical spacing is provided between the DIMM sockets 30. In the illustrated embodiment, the DIMM pitch (i.e., center-to-center spacing of the DIMMs) may be 10.16 mm, for example. The actual spacing between the DIMM sockets is smaller than that the DIMM pitch, and depends upon the widths of the DIMM sockets, and the widths of the DIMM sockets depends upon the DIMM thicknesses. The DIMM spacing also takes into account the geometry of either heat pipes or liquid flow pipes to be positioned between the DIMM sockets. A central processing unit (CPU) 36 on the system board 12 generates input/output (I/O) instructions for alternately writing and reading from the DIMMs to be installed in the DIMM sockets 30. The memory system 10 also includes a memory controller 34 in electronic communication with the DIMM sockets 30 for processing the I/O instructions.

In this embodiment, chilled liquid, such as water, is routed along the system board 12 between the DIMM sockets 30. A chilled liquid flow assembly includes a first block 40, a second block 140, and a plurality of spaced-apart liquid flow pipes 50 extending along the system board 12 between the DIMM sockets 30 from the first block 40 to the second block 140. The first block 40 includes a liquid inlet port 42 connected to a primary flow passage 43 and a plurality of liquid flow passages 44 branching off of the primary flow passage 43. The second block 140 includes a liquid outlet port 142 connected to a primary flow passage 143 and a plurality of liquid flow passages 144 branching off of the primary flow passage 143. The blocks 40, 140 are hereinafter referred to as "manifold blocks" 40 in this embodiment because the plurality of liquid flow passages 44, 144 route the chilled liquid in parallel to the liquid flow pipes 50. Each liquid flow pipe 50 fluidly couples a respective one of the branched flow passages 43 on the first manifold block 40 to a respective one of the branched flow passage 143 of the second manifold block 140. The portions of the liquid flow pipes 50 between the DIMM sockets 30 are in very close proximity to the system board 12, and may make contact with the system board.

In this embodiment, the liquid source is a chilled liquid source 80 as schematically diagrammed in FIG. 1. The chilled liquid source 80 may be a conventional water chiller supplying chilled water to a variety of locations throughout a building, such as at a data center. The chilled liquid source includes a chiller 84 for chilling the liquid and a pump 82 for moving the chilled liquid. The liquid source 80 is fluidly coupled to the liquid inlet port 42 of the first manifold block 40, providing a flow of chilled liquid to the first manifold block 40 as needed. For example, the chilled liquid may flow as a continuous stream or a periodic stream to control the temperature of the memory modules. The chilled liquid supplied to the liquid inlet port 42 flows through the primary flow passage 43 and each of the branched flow passages 44 to the liquid flow pipes 50. The chilled liquid flows in parallel through the liquid flow pipes 50 to the second manifold block and exits through the liquid outlet port 142. Optionally, the liquid outlet port 142 of the second manifold block 140 may be coupled to a re-circulation system 150, as shown. The re-circulation system 150 may route the heated liquid back to the chilled liquid source 80. The re-circulation system 150 may also include a filtering subsystem to filter out any contaminants (e.g. corrosion byproducts), along with chemicals for treating the re-circulated water. Thus, heated liquid exiting the second manifold block 140 may be returned to the chiller 84 to be chilled, and then returned to the liquid inlet port 42 of the first manifold block 40. As an alternative to re-circulating the heated water exiting the second manifold block 140, the heated water may simply be drained from the system.

In the configuration of FIG. 1, the chilled liquid is supplied only to the first manifold block 40, and all of the chilled liquid flows through the liquid flow pipes 50 from the first manifold block 40 to the second manifold block 140. The cooling system is not limited to such unidirectional flow, however. In another embodiment, for example, chilled liquid may alternatively be provided to both manifold blocks 40, 140. Each manifold block 40, 140 may include both an inlet port and an outlet port, with an alternative routing of flow passages provided, so that chilled liquid flows through some of the liquid flow pipes 50 from the first manifold block 40 to the second manifold block 140 and chilled liquid flows through other liquid flow pipes from the second manifold block 140 to the first manifold block 40. For example, the chilled liquid may flow through the liquid flow pipes 50 in alternating directions, such that the direction of flow through one liquid flow pipe is opposite the direction of flow through the nearest adjacent liquid flow pipe.

Figure 2:
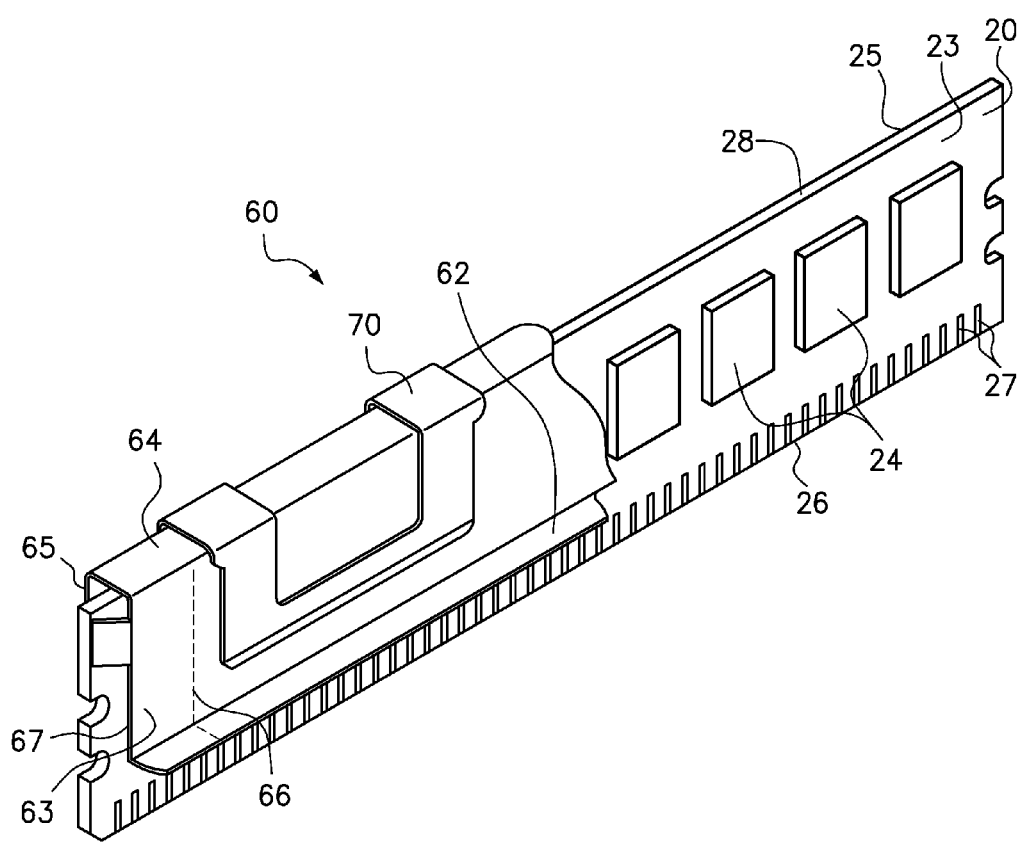
FIG. 2 is a partially cut-away perspective view of a memory module with a heat spreader attached with spring clips.
Figure 4:
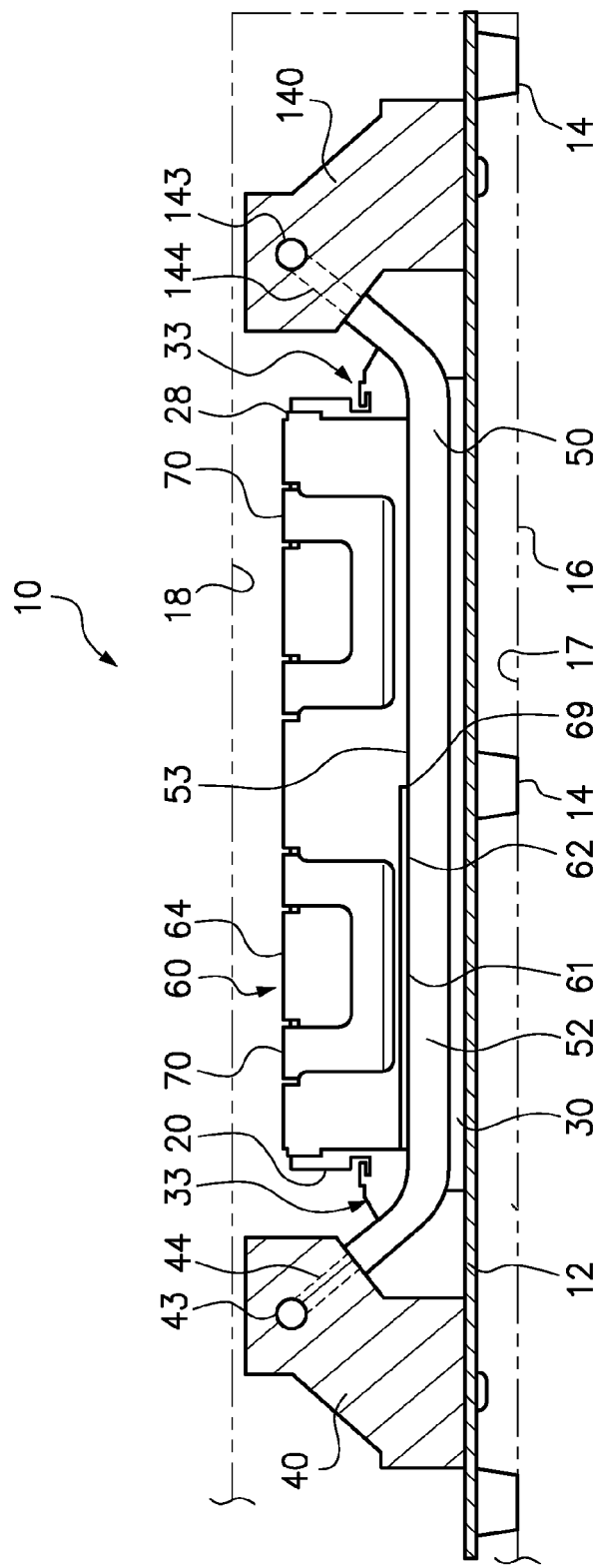
FIG. 4 is an elevation view of the liquid-cooled memory system of FIG. 3 as taken along section lines 4-4 of FIG. 3.

FIG. 2 is a partially cut-away perspective view of a DIMM 20 with a heat spreader 60 attached to the DIMM with spring clips 70 (only one shown; see also FIG. 4). The DIMM 20 includes a plurality of DRAM chips 24 on opposing faces 23, 25 of the DIMM and a plurality of electrical contacts ("pins") 27 along a lower, card-edge connector 26. A slot on a DIMM socket (e.g. the slot 32 on a DIMM socket 30 in FIG. 1) is configured to receive the card-edge connector 26, with the pins 27 in electrical communication with corresponding electrical contacts in the DIMM socket. The heat spreader 60 includes parallel plates 63, 65 in thermal engagement with opposing faces 23, 25 of the DIMM 20, to dissipate heat from the DRAM chips 24 on the DIMM 20. In this embodiment, the heat spreader 60 is a unitary structure, wherein the parallel plates 63, 65 are joined by a central connective portion 64. The heat spreader 60 flexes slightly at the central connective portion 64 so that the force of the spring clips 70 is able to move the plates 63, 65 into thermal engagement with the opposing faces 23, 25 of the DIMM 20. The central connective portion 64 may engage an upper edge 28 of the DIMM 20 opposite the lower card edge connector 26. In an alternative embodiment, a heat spreader could have structurally separate plates that are urged by the spring clips 79 against the opposing faces 23, 25 of the DIMM 20.

The heat spreader 60 further includes a ridge 62 extending transversely outwardly from the first heat spreader plate 63. A similar ridge (not shown) may be provided on the other side of the heat spreader 60 on the second heat spreader plate 65. The ridge 62 is preferably substantially perpendicular to the first heat spreader plate 63, which gives the heat spreader 60 a substantially "L" shaped cross-section traced at 66. Optionally, the ridge 62 only extends along part of the length of the first heat spreader plate 63. More specifically, the ridge 62 in this embodiment extends along about half the length of the plate 63, from one end 67 of the first heat spreader plate 63 to about the center of the first heat spreader plate 63. This configuration of the ridge 62 causes the ridge 62 to thermally engage one of the liquid flow pipes 50 (see FIG. 1) when the heat spreader 60 is in an installed position on the DIMM 20 and the DIMM 20 is in an installed position in a DIMM socket, to conduct heat from the DIMM 20 to the liquid flow pipes 50.

Figure 3:
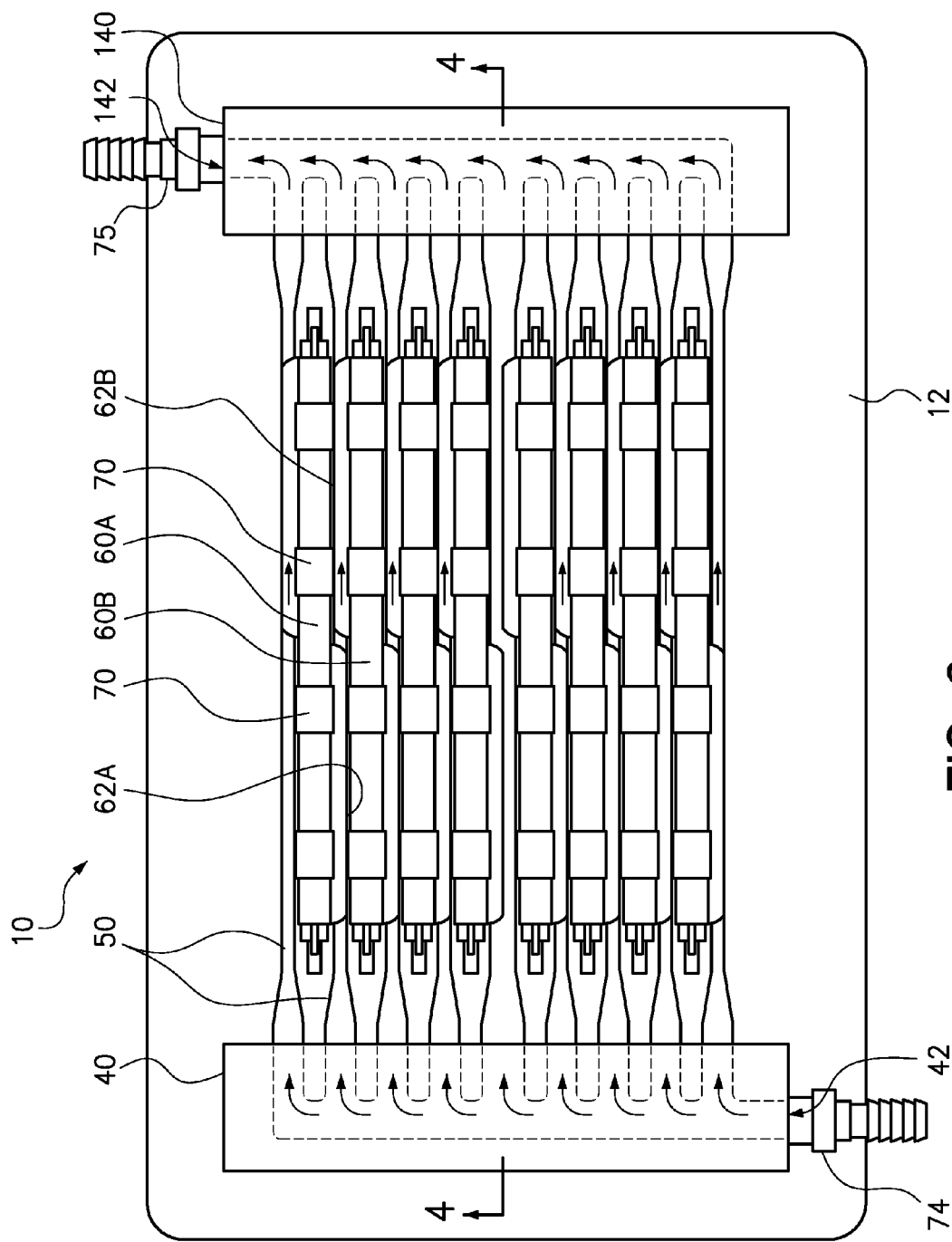
FIG. 3 is a plan view of the computer memory system with a plurality of memory modules and attached heat spreaders installed between the liquid flow pipes.

FIG. 3 is a plan view of the liquid-cooled computer memory system 10 of FIG. 1 with one memory module and heat spreader 60 of FIG. 2 installed at each DIMM socket 30 (the DIMMs are concealed from view by the attached heat spreaders 60). A fluid inlet coupler 74 is provided for coupling a conventional chilled liquid supply hose to the liquid inlet port 42, and a fluid outlet coupler 75 is provided for coupling a conventional liquid return hose to the liquid outlet port 142. As can be seen from this plan view, the positioning of the liquid flow pipes 50 between the DIMM sockets 30 correspondingly positions one liquid flow pipe 50 between each pair of adjacent DIMMs and attached heat spreader 60. As shown, the system also includes a liquid flow pipe 50 on either side of the outermost sockets. Each DIMM and the attached heat spreader 60 is installed in the respective DIMM socket 30 in an insertion direction that is perpendicular to the system board 12. The orientation of each ridge 62 relative to the plates of the heat spreader 60 to which the ridge 62 is attached positions the ridge 62 substantially parallel to the system board 12. Thus, installing a DIMM and the attached heat spreader 60 in the insertion direction brings the ridge 62 into thermal engagement with an upper surface of an adjacent (nearest) liquid flow pipe 50. A thin thermal interface material (TIM) is optionally applied between the liquid flow pipe 50 and the ridges 62A, 62B. Due to the orientation of the ridges 62 parallel to the system board and the direction of insertion being perpendicular toward the system board 12, the ridges contact the liquid flow pipes 50 in predominantly (or entirely) in compression, with little or no component of shear. This feature of predominantly compressive forces between the ridges 62 and liquid flow pipes 50 preserves the integrity of any TIM applied between the ridges 62 and liquid flow pipes 50.

The plan view of FIG. 3 illustrates how the ridges 62 on the heat spreaders 60 are interleaved. Two ridges from adjacent first and second heat spreaders 60A and 60B are individually referenced at 62A and 62B. The first and second heat spreaders 60A, 60B are aligned above adjacent DIMM sockets 30, which positions the two heat spreaders 60A, 60B adjacent to the same liquid flow pipe 50 between the respective DIMM sockets 30. The first ridge 62A on the first heat spreader 60A and the second ridge 62B on the second heat spreader 60B thermally engage the same, adjacent (nearest) liquid flow pipe 50 extending along the system board 12 between the two heat spreaders 60A, 60B. The two ridges 62A, 62B preferably engage the same liquid flow pipe 50 along most of (e.g., at least 75% of) the length of one memory module socket or heat spreader, to provide ample contact surface area for heat transfer from the ridges to the liquid flow pipes 50. In this particular embodiment, each ridge 62A, 62B extends almost halfway along the length of the respective heat spreader 60, from opposite ends of the heat spreaders 60A, 60B to about the centers of the heat spreaders 60A, 60B, to thermally engage the same liquid flow pipe 50 along almost 100% of the length of one memory module socket. This nearly maximizes the surface area over which the ridges 62A, 62B directly thermally engage the central liquid flow pipe 50, but without the ridges 62A, 62B overlapping or otherwise interfering with one another. This description of interleaving of ridges 62 applies to each other pair of adjacent heat spreaders 60 in the memory system 10. It should be recognized that alternative interleaving structures may be similarly used, such as multiple ridges from one heat spreader interleaving with multiple ridges from the adjacent heat spreader. In this view, two separate CPU DIMM banks shown. As a result, the spacing between the two banks of DIMMs is slightly greater than the DIMM spacing in each bank. The center liquid flow pipe is therefore larger.

FIG. 4 is an elevation view of the liquid-cooled memory system 10 of FIG. 3 as taken along section lines 4-4, further detailing aspects of the liquid-cooled memory system 10. An outline of a possible enclosure or chassis 16 is provided for reference. The chassis 16 may be a 1 U server chassis, for example. The system board 12 is shown supported on one wall 17 of the chassis 16 with soft bumpers 14, which may help protect delicate system components by dampening vibrations to the chassis 16. The outline of the chassis 16 also helps show the minimal effect that the cooling system components have on chassis dimensions. As shown, the 1 U server chassis 16 is fairly narrow, with a spacing between opposing walls 17, 18 that is only slightly larger than a height of the DIMMs 20. The central connective portion 64 of the heat spreader 60 is only slightly above the upper edge 28 of the DIMM 20, with a fairly small spacing between the wall 18 and the heat spreader 60. The manifold blocks 40, 140 are of generally equal height, which may be only slightly higher than the heat spreader 60 with respect to the system board 12. Thus, the manifold blocks 40, 140 still fit within existing, standardized 1 U chassis dimensional constraints. The manifold blocks 40, 140 are positioned at opposite ends of the bank of DIMMs 20. Sufficient spacing is provided between the manifold blocks 40, 140 and the heat spreaders 60 to access the latches 33 by hand to release the DIMMs 20 and the attached heat spreaders 60.

The liquid flow pipes 50 have a generally "U" shaped profile, angled downwardly where ends of the liquid flow pipes 50 are coupled to the liquid flow passages 44, 144, toward a straight segment 52 that extends along the system board 12. The U-shaped profile of the liquid flow pipe 50 positions the straight segment 52 in close proximity to the system board 12. The straight segment 52 may be flat against a body of the DIMM socket 30, although the straight segment 52 could alternatively be in direct contact with the system board 12. The liquid flow pipe 50 is also preferably tapered from a generally circular cross-section where the ends are connected to the manifold blocks 40, 140, to a generally rectangular cross-section along the straight segment 52. The rectangular cross-section of the straight segment 52 provides a flat upper surface 53 thermally engaged by a flat lower surface 61 of the ridge 62, for optimal heat transfer between the heat spreader 60 and the liquid flow pipe 50. The flat upper surface 53 of the liquid flow pipe 50 preferably does not rise above the DIMM socket 30, to minimize interference with accessing the DIMMs 20 and heat spreaders 60 by hand.

As discussed previously, the ridge 62 extends along about half of the length of the DIMM 20 and DIMM socket 30, which is about half of the length of the straight segment 52 of the liquid flow pipe 50 in this embodiment. The ridge 62 terminates at an end 69 that is approximately at the center of the straight segment 52, which coincides with the center of the DIMM socket 30. Another ridge from another heat spreader (not shown) may thereby contact the remaining exposed portion of the liquid flow pipe 50 at the flat upper surface 53.

Figure 5:
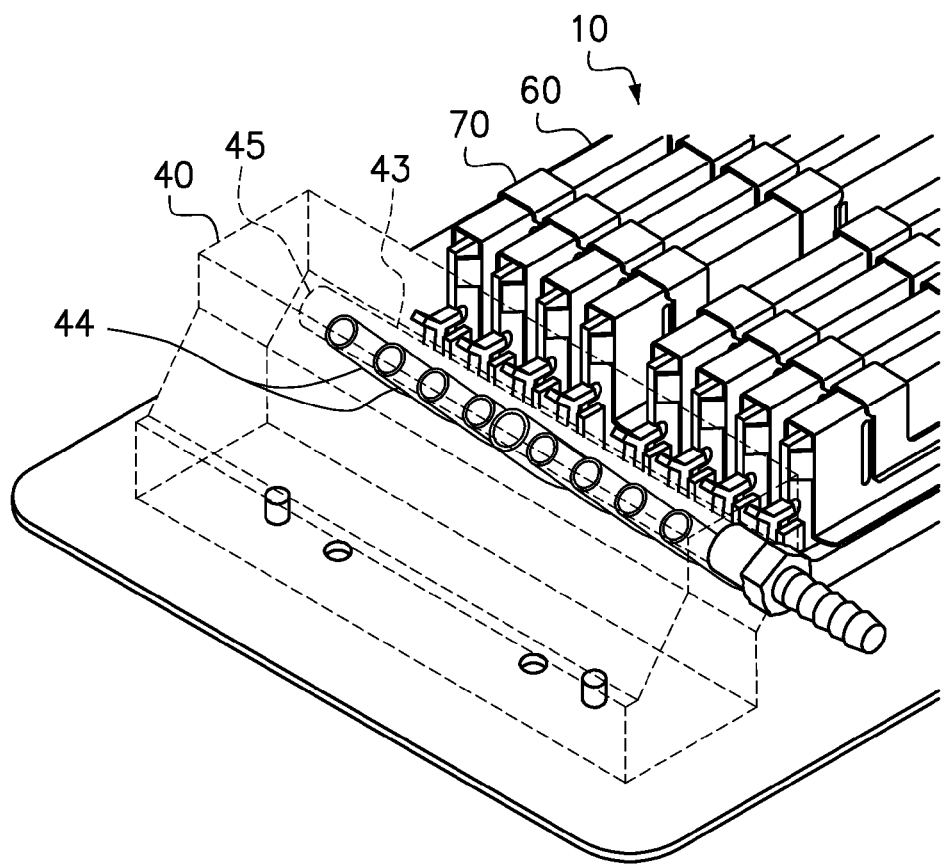
FIG. 5 is a perspective view of the liquid-cooled memory system revealing some hidden details of one manifold block.

FIG. 5 is a perspective view of the liquid-cooled memory system 10, further detailing the first manifold block 40. The primary flow passage 43 is closed at one end 45 so that all of the chilled liquid is constrained to flow through the flow passages 44 that branch off the primary flow passage 43. An example geometry is shown for the liquid flow pipes 50. However, the shape of the liquid flow pipes may deviate from what is shown, and may be optimized for a specific working embodiment to provide the proper flow distribution within the DIMM field and within the larger system as well.

Figure 6:
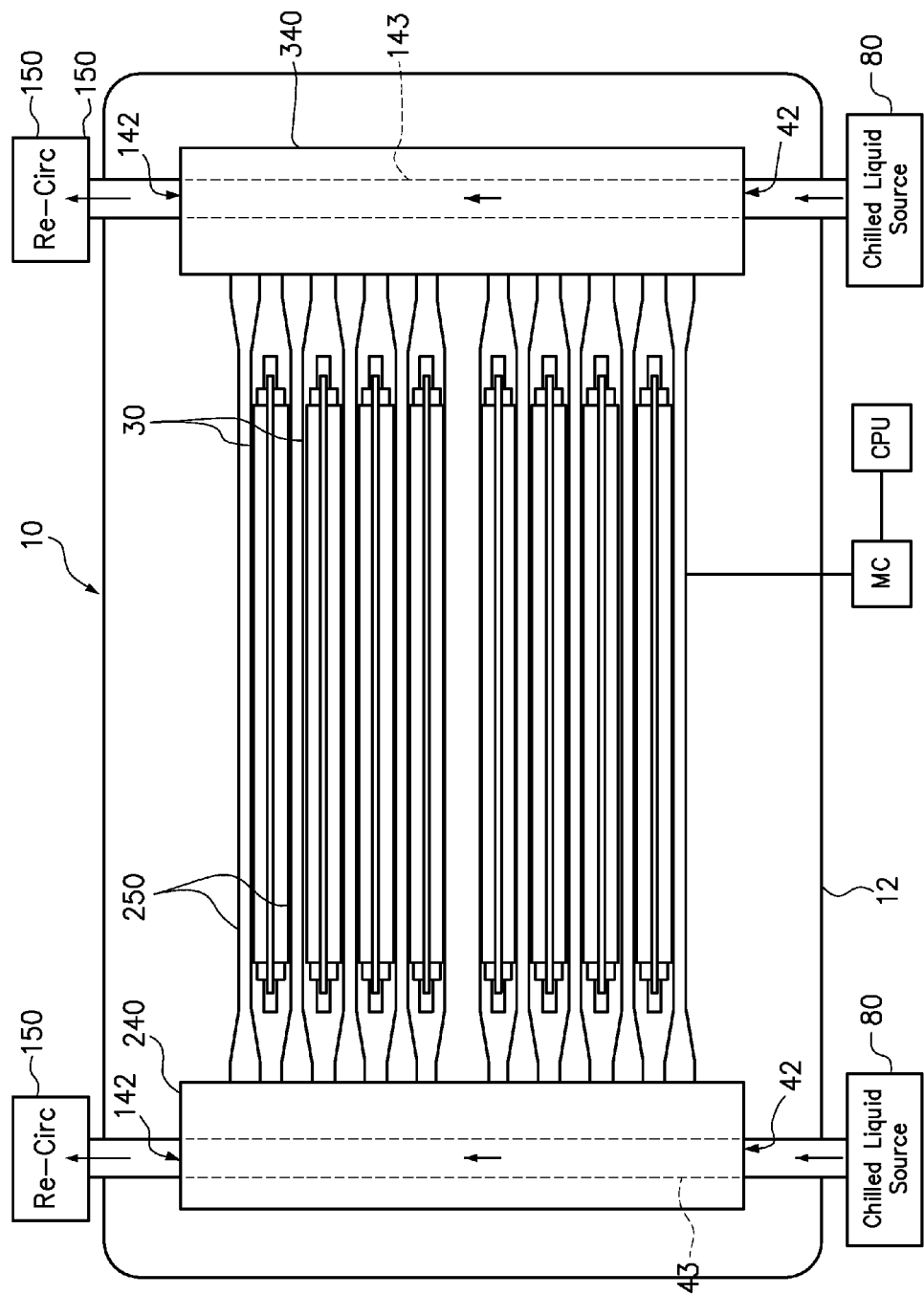
FIG. 6 is a plan view of an alternative embodiment of a computer memory system with a plurality of closed heat pipes extending along the system board between memory module sockets.

FIG. 6 is a plan view of an alternative embodiment of a liquid-cooled computer memory system 210 having a plurality of closed heat pipes 250 (instead of liquid flow pipes) positioned between DIMM sockets 30 to conduct heat from DIMMs to liquid-cooled blocks 240, 340. Like in the embodiment of FIG. 1, the memory system 210 includes two sets of four DIMM sockets 30 arranged in parallel on the system board 12. In this embodiment, the liquid source 80 is fluidly coupled to liquid inlet ports 42 of both blocks 240, 340 providing a flow of chilled liquid through both blocks 240, 340. Liquid outlet ports 142 on both the first and second blocks 240, 340 may be coupled to the re-circulation system 150, to route the heated liquid back to the chilled liquid source 80. However, the chilled liquid is not flowed between the DIMM sockets 30 like it is in the embodiment of FIGS. 1-5. Rather, the chilled liquid flowing through the blocks 240, 340 cools the blocks 240, 340, to maintain the blocks 240, 340 at a lower temperature than the DIMMs, and the heat pipes 250 conduct heat from the DIMMs to the blocks 240, 340. The heat pipes 250 contain a working fluid that evaporates on hot surfaces and re-condenses elsewhere in the heat pipes 250, to facilitate heat conduction through the heat pipes 250 from the DIMMs to the blocks 240, 340. Because the ends of the heat pipes 250 are closed, however, the working fluid is confined to the sealed heat pipes 250 and is separate from the chilled liquid circulating through each block 240, 340.

The same heat spreaders used to conduct heat from the DIMMs to the liquid flow pipes in the FIG. 1 embodiment, or conceptually similar heat spreaders, may be used to instead conduct heat from the DIMMs to the heat pipes in the FIG. 6 embodiment. For purpose of an example, the heat pipes 250 may have the same geometry and dimensions as the liquid flow pipes in FIG. 1. Thus, when the heat spreaders are installed over DIMMs in the DIMM sockets 30, ridges on the heat spreaders contact the heat pipes 250 to thermally bridge the DIMMs to the heat pipes. The heat spreaders thereby conduct heat from the DIMMs to the heat pipes 250 when the heat spreaders are in an installed position. In a practical working embodiment, the geometry of the heat pipes 250 may be optimized for beneficial heat conduction, and may therefore have a geometry and outer dimensions that vary from that of the liquid flow pipes in FIG. 1. The geometry of the heat spreaders and the included ridges may be configured according to the geometry and dimensions of the heat pipes 250, to thermally bridge the DIMMs to the heat pipes 250. The heat pipes 250, like the liquid flow pipes in FIGS. 1-5, extend along the system board, between the DIMM sockets 30, so that the heat pipes 250 do not interfere with installation or removal of the DIMMs and heat spreaders.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, components and/or groups, but do not preclude the presence or addition of one or more other features, integers, steps, operations, elements, components, and/or groups thereof. The terms "preferably," "preferred," "prefer," "optionally," "may," and similar terms are used to indicate that an item, condition or step being referred to is an optional (not required) feature of the invention.

The corresponding structures, materials, acts, and equivalents of all means or steps plus function elements in the claims below are intended to include any structure, material, or act for performing the function in combination with other claimed elements as specifically claimed. The description of the present invention has been presented for purposes of illustration and description, but it is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A computer memory system comprising:
  a plurality of memory modules sockets spaced apart on a system board configured for receiving a plurality of memory modules, each memory module socket configured for releasably receiving a card edge connector of a memory module of the plurality of memory modules;
  a liquid flow assembly including a first block having a liquid flow passage, a second block having a liquid flow passage, a chilled liquid source in fluid communication with the blocks, and a plurality of heat transfer pipes thermally coupling the first block to the second block, the heat transfer pipes extending along the system board between the memory module sockets from the first block to the second block; and
  a plurality of heat spreaders, each heat spreader having a pair of parallel plates in thermal engagement with opposing faces of a respective one of the memory modules and a ridge extending transversely outwardly from at least one of the plates to thermally engage an adjacent one of the heat transfer pipes, wherein along a length of the adjacent one of the heat transfer pipes extending from the first block to the second block, the ridge on a first one of the heat spreaders positioned on a first one of the memory modules is interleaved with the ridge on a second one of the heat spreaders positioned on a second one of the memory modules adjacent the first one of memory modules, such that the ridge from the first one of the heat spreaders thermally engages a first part of the adjacent one of the heat transfer pipes and not a second part of the adjacent one of the heat transfer pipes, and the ridge from the second one of the heat spreaders thermally engages a second part of the adjacent one of the heat transfer pipes and not a first part of the adjacent one of the heat transfer pipes.

2. The computer memory system of claim 1, further comprising:
a liquid inlet port on the first block in fluid communication with the liquid flow passage of the first block and coupled to the chilled liquid source;
a liquid outlet port on the second block in fluid communication with the liquid flow passage of the second block; and
wherein the heat transfer pipes comprise parallel liquid flow pipes fluidly coupling the flow passage of the first block to the flow passage of the second block.

3. The computer memory system of claim 1, wherein the ridge from the first one of the heat spreaders and the ridge from the second one of the heat spreaders thermally engage the adjacent one of the heat transfer pipes along a total of at least 75% of a length of one of the memory module sockets extending from the first block to the second block.

4. The computer memory system of claim 1, wherein the heat transfer pipes further comprise: closed, hollow heat pipes containing a working fluid separated from a chilled fluid from the chilled fluid source in the blocks.

5. The computer memory system of claim 1, wherein the ridge thermally engages the adjacent one of heat transfer pipes along less than half the length of the adjacent one of heat transfer pipes.

6. The computer memory system of claim 1, wherein each heat spreader is configured for the ridge to thermally engage the adjacent one of the heat transfer pipes in response to the memory module and the heat spreader being in installed positions, and for the ridge to thermally disengage from the adjacent one of the heat transfer pipes in response to the heat spreader being lifted from the memory module or the memory module being lifted from the memory module socket.

7. The computer memory system of claim 1, wherein each heat spreader is a unitary structure, and wherein the pair of parallel plates are connected by a central connective portion.

8. The computer memory system of claim 1, further comprising: a spring clip removably positionable on each heat spreader to bias the plates of each heat spreader into thermal contact with the opposing faces of the memory module.

9. The computer memory system of claim 1, wherein each of the heat transfer pipes have a generally U-shaped path angled downward toward the system board from locations at ends secured to the blocks.

10. The computer memory system of claim 1, wherein each memory module socket comprises one or more latches operable to selectively release a received memory module of the plurality of memory modules, and wherein the heat spreaders and the heat transfer pipes avoid interference with operation of the one or more latches and with the removal of the memory modules from the memory module sockets.

11. The computer memory system of claim 1, wherein a portion of each heat transfer pipe extends along the system board for at least the full length of the nearest memory module socket.

12. The computer memory system of claim 11, wherein the portion of each heat transfer pipe that extends along the system board is no taller than a nearest memory module socket of the plurality of memory modules sockets.

13. The computer memory system of claim 1, wherein each ridge is perpendicular to the plate from which the ridge extends.

14. The computer memory system of claim 1, wherein the memory modules are dual in-line memory modules.

15. The computer memory system of claim 1, further comprising: a thermal interface material applied to the heat transfer pipes at locations of thermal engagement by each ridge, wherein the thermal interface material is in predominantly compression between the heat transfer pipes and each included ridge.

16. A cooling system for a computer memory system, the computer memory system including a plurality of memory modules sockets spaced apart on a system board, each memory module socket configured for releasably receiving a card edge connector of a respective memory module, the cooling system comprising:
a liquid flow assembly including a first manifold block having a liquid inlet port, a second manifold block having a liquid outlet port, and a plurality of spaced-apart liquid flow pipes fluidly coupling the liquid inlet port of the first manifold block to the liquid outlet port of the second manifold block, the liquid flow pipes extending along the system board between the memory module sockets from the first manifold block to the second manifold block; and
a plurality of heat spreaders, each heat spreader having a pair of parallel plates in thermal engagement with opposing faces of the respective memory module and a ridge extending transversely outwardly from at least one of the plates to thermally engage an adjacent one of the liquid flow pipes,
wherein along a length of the adjacent one of the liquid flow pipes extending from the first manifold block to the second manifold block, the ridge on a first one of the heat spreaders positioned on a first respective memory module is interleaved with the ridge on a second one of the heat spreaders positioned on a second respective memory module adjacent the first respective memory module, such that the ridge from the first one of the heat spreaders thermally engages a first part of the adjacent one of the liquid flow pipes and not a second part of the adjacent one of the liquid flow pipes, and the ridge from the second one of the heat spreaders thermally engages a second part of the adjacent one of the liquid flow pipes and not a first part of the adjacent one of the liquid flow pipes.

* * * * *